(12) United States Patent
Ando et al.

(10) Patent No.: US 7,700,916 B2
(45) Date of Patent: Apr. 20, 2010

(54) LOGICAL CAD NAVIGATION FOR DEVICE CHARACTERISTICS EVALUATION SYSTEM

(75) Inventors: Tohru Ando, Tokyo (JP); Tsutomu Saito, Hitachinaka (JP); Yasuhiko Nara, Hitachinaka (JP); Mikio Takagi, Matsudo (JP); Koichi Takauchi, Chiba (JP)

(73) Assignee: Hitachi High-Technologies Corporation, Tokyo (JP)

( * ) Notice: Subject to any disclaimer, the term of this patent is extended or adjusted under 35 U.S.C. 154(b) by 692 days.

(21) Appl. No.: 11/583,983

(22) Filed: Oct. 20, 2006

(65) Prior Publication Data

US 2007/0124713 A1 May 31, 2007

(30) Foreign Application Priority Data

Oct. 21, 2005 (JP) ............................. 2005-307584

(51) Int. Cl.
*G01N 23/00* (2006.01)
*G21K 7/00* (2006.01)
(52) U.S. Cl. ..................... 250/310; 250/306; 250/307; 250/311; 250/492.1; 250/492.2; 382/149; 382/145; 382/199; 382/141; 382/209; 356/237.2; 356/398; 715/5

(58) Field of Classification Search ................ 250/306, 250/307, 310, 311, 492.1, 492.2; 382/149, 382/145, 199, 141, 209; 356/237.2, 398; 715/5
See application file for complete search history.

(56) References Cited

U.S. PATENT DOCUMENTS 7,235,782 B2 * 6/2007 Takane et al. ............... 250/310
2004/0081350 A1 * 4/2004 Kitamura et al. ............ 382/149

FOREIGN PATENT DOCUMENTS

JP          2000-164659 A      6/2000

* cited by examiner

*Primary Examiner*—Nikita Wells
*Assistant Examiner*—Meenakshi S Sahu
(74) *Attorney, Agent, or Firm*—McDermott Will & Emery LLP (57) ABSTRACT

A navigation system for easily determining defective positions is provided. In the case of CAD navigation to defective positions, logical information for indicating defective positions is created in a CAD format, instead of CAD data of physical information indicating circuit design. Specifically, by attaching marks such as rectangles, characters, or lines, to an electron microscope image with software, quick navigation is performed with required minimum information. By using created CAD data, re-navigation with the same equipment and CAD navigation to heterogeneous equipment are performed.

19 Claims, 11 Drawing Sheets

LOGICAL CAD NAVIGATION FOR DEVICE CHARACTERISTICS EVALUATION SYSTEM

CLAIM OF PRIORITY

The present application claims priority from Japanese application JP 2005-307584 filed on Oct. 21, 2005, the content of which is hereby incorporated by reference into this application.

BACKGROUND OF THE INVENTION

1. Field of the Invention

The present invention relates to a semiconductor inspection equipment for inspecting semiconductors or analyzing defects of semiconductors, and in particular, it relates to a semiconductor inspection equipment having a navigation function with respect to defective positions.

2. Background Art

When a defective position of a semiconductor is logically determined, it is necessary to physically clarify the defective position for performing an observation through probing, processing (FIB: Focused Ion Beam), or a microscope. Generally, a process of clarifying such defective position is automatically carried out through CAD navigation utilizing CAD data indicating circuit design used when a semiconductor is manufactured.

Patent Document 1: JP Patent Publication (Kokai) No. 2000-164659 A

SUMMARY OF THE INVENTION

In recent years, with an increase in capacity and miniaturization of semiconductors and with an increase in accuracy, layer, and complexity of circuits, accuracy on the order of nm is being demanded for determining defective positions. CAD data indicating such minute information is increasing to approximately 100 G bytes. Searching enormous quantities of CAD data for a defective position, and loading/displaying CAD data are beginning to require a considerable amount of time. Meanwhile, attempts have been made to solve the above problems by deleting data unnecessary for analysis beforehand. However, this method is also beginning to require time since it is necessary to determine how necessary data and unnecessary data should be separated, and initial data is enormous.

Basically, in CAD data indicating circuit design, even a single wire is accurately displayed for manufacturing a semiconductor, resulting in a large amount of data as described above. However, as data indicating defective positions of semiconductors, such CAD data does not have necessary information but has too much unnecessary information. Further, if probing of a semiconductor inspection equipment is taken for example, when a plurality of possibly defective positions are found and one of such defective positions is determined through probing (a test for measuring electrical characteristics by bringing an electrode probe into contact with an object to be measured) with a semiconductor inspection equipment, it is desirable to put only the thus determined defective position into CAD data. Particularly, when electrical characteristics are measured by bringing a probe into contact with a plug on the order of several dozen nm, it is very stressful to recognize a target plug among similar plug patterns with an electron microscope image alone.

As a problem when new CAD data is created, failure to easily display the repetition number of important positions, mats and plugs, results in display of incorrect positions. Further, there are cases in which CAD data for circuit design cannot be obtained from a viewpoint of security, and counting the repetition number of mats and plugs by visual observation can be easily the cause of false recognition.

It is an object of the present invention to provide a navigation system by which defective positions can be easily determined when a semiconductor device is inspected with an electron microscope image.

In the present invention, in semiconductor inspection, logical information for the purpose of indicating defective positions is created in a CAD format, instead of CAD data of physical information indicating circuit design, when CAD navigation to defective positions is performed. For example, by attaching marks such as rectangles, characters, or lines, on an electron microscope image with software, quick navigation is performed with required minimum information. Preferably, by using created CAD data, re-navigation with the same equipment and CAD navigation to a heterogeneous equipment are performed.

Namely, as an example, a semiconductor inspection equipment of the present invention comprises a movable stage while holding a semiconductor sample, a sample image acquisition unit that irradiates the semiconductor sample held on the stage with a charged particle beam, so as to obtain a sample image through a sample signal discharged from the sample due to irradiation of the charged particle beam, a memory unit for storing CAD data concerning the semiconductor sample, and a display unit capable of displaying CAD data such that the CAD data is superimposed on the sample image obtained by the sample image acquisition unit. Further, the semiconductor inspection equipment of the present invention has a grid creation means that generates a grid composed of vertical and horizontal lines having a constant distance, so as to superimpose the grid on the sample image displayed on the display unit, and a means of generating systematic numbers indicating vertical and horizontal positions of a plurality of rectangular areas contained in the grid created by the grid creation means, so as to display the numbers in relevant areas in the grid displayed on the display unit.

Preferably, the grid creation means has a function of generating another grid having a narrower distance between the lines thereof in one rectangular area of the previously created grid. The grid generated by the grid creation means and then superimposed on the sample image displayed on the display unit is stored as CAD data. Further, the semiconductor inspection equipment of the present invention preferably has a means of generating characters, symbols, lines, figures, and/or painted figures, so as to superimpose them on the sample image displayed on the display unit.

In the present invention, additional information of CAD data for indicating defective positions used for semiconductor inspection/analysis is newly created on a microscopic observation image of a semiconductor inspection equipment with simple operation, without using CAD data of circuit design used with a semiconductor manufacturing equipment as in a conventional technology. While a CAD data format according to the present invention is the same as that for circuit design, the purpose is to indicate defective positions of a semiconductor. By using a CAD data format as a data format, it becomes easier to find a defective position repeatedly with the data, and also such format can be used as a means of cooperating with another type of semiconductor inspection/analysis equipment.

For example, in the case of probing using the semiconductor inspection/analysis equipment, the type of plug can be identified by its initial letter or color; a tick indicating completion of each plug is displayed in accordance with the status of inspection/analysis; wires, cut surfaces, and target areas are displayed by using solid/dashed lines or changing the thickness of the line; a display method by which layers are divided into hierarchies is used; and same-sized markers are displayed irrespective of display magnification. These can be registered in CAD data as additional information indicating defective positions with simple operation of clicking and dragging individual operation buttons. Further, in order to create additional information with simple screen operation, if functions such as copying, cutting, x-axis inversion, and y-axis inversion are provided, usability can be improved.

In accordance with the present invention, quick and accurate positioning can be achieved, whereby usability for equipment users is improved.

DESCRIPTION OF PREFERRED
EMBODIMENTS OF THE INVENTION

Embodiments of the present invention will be hereafter described with reference to the drawings.

Figure 1:
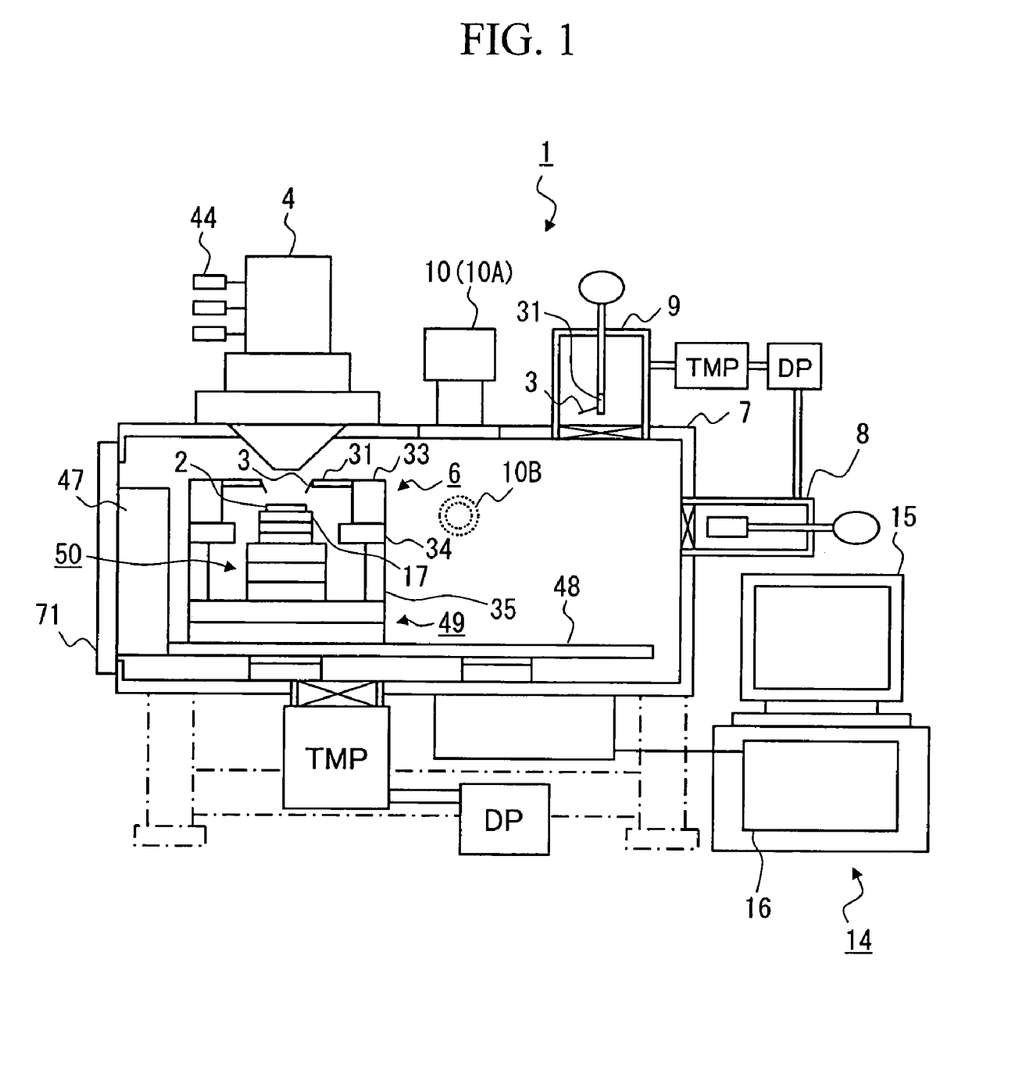
FIG. 1 shows a constitutional example of a semiconductor inspection equipment.

FIG. 1 shows a constitutional example of an embodiment of a semiconductor inspection equipment 1 of the present invention. In FIG. 1, the semiconductor inspection equipment 1 comprises in a sample chamber 7 a probe stage 6, which includes a stage including a sample holder 2 for holding a sample and a sample holder receiver 17 for holding the sample holder 2, and a probe unit 33. While a sample is fixed on the sample holder 2, since it is a thin piece, it is not shown for convenience of drawing figures. In order to inspect the sample, an electro-optical device 4 (charged particle device) provided with an ion pump 44, such as SEM (Scanning Electron Microscope) or FIB, is provided opposite to the sample holder 2 on the housing of the sample chamber 7. A sample image formed based on a sample signal, such as secondary electrons, discharged from a sample by an electron beam or an ion beam emitted from the electron optical device 4 is displayed on a display 15 of a display unit 14. The display unit 14 comprises a display body 16 having a function of controlling a SEM image, a CCD image from a CCD (Charge Coupled Device) camera, and data from a CAD navigation body and a function of controlling a stage, probe, exhaust system, and optical system through a GUI (Graphical User Interface) screen, in addition to a display function. Further, the display body 16 includes a CPU (Central Processing Unit), a memory, and a hard disk.

Further, a probe coarse adjustment image acquisition device 10 is provided in the vicinity of the electro-optical device 4. From the electro-optical device 4, a charged particle beam (electron or ion beam) for observing a sample surface or movement of probes 3 is emitted in the direction of the sample holder 2. The probe coarse adjustment image acquisition device 10 arranged in parallel and in the vicinity of the electro-optical device 4 on the upper surface portion of the housing of the sample chamber 7 comprises a probe coarse adjustment optical microscope and a CCD camera for acquiring an image. With this device 10, a state of coarse adjustment with respect to the sample via the probes 3 is observed, and it can be acquired as image information. With regard to the probe coarse adjustment image acquisition device 10, not only a longitudinal direction type 10A but also a lateral direction arrangement type 10B for a cross-shape arrangement is used. With this cross-shaped arrangement, the probes 3 are observed longitudinally and laterally, whereby the state of coarse adjustment is reliably grasped. The magnification of an image through coarse adjustment in the lateral direction is made greater than that of an image through coarse adjustment from above. For measurement, first, a coarse adjustment for bringing the probes 3 closer to the horizontal direction is performed with the use of the above probe coarse adjustment image acquisition device 10A, and at this point, it is necessary to capture the plurality of probes 3 on an image through coarse adjustment. With regard to coarse adjustment in the lateral direction, the probes 3 are brought down so that they become in proximity to the sample while examining an image through coarse adjustment in the lateral direction. Next, an operation of bringing the probes 3 into contact with the sample is performed while examining adjustment of the focus of the tips of the probes 3 and the sample, using the electro-optical device 4. If the distance between the probes 3 and the sample is small when the coarse adjustment in the lateral direction is performed, time necessary for the operation of bringing the probes 3 close to the sample using the electro-optical device 4 can be shortened. For this reason, the magnification of an image through coarse adjustment in the lateral direction is made greater than that of an image through coarse adjustment from above.

The stage comprises the sample holder 2 for holding a sample, a sample stage 50 on which the sample holder 2 is mounted, a large stage 49 on which the sample stage 50 is mounted, and a base 48 on which the large stage 49 is moved.

At a place immediately below the probe coarse adjustment image acquisition device 10 where the positioning of coarse adjustment is performed, the positional relationship between the probes and the positional relationship between each probe and a sample are measured, and each probe or a set of probes is positioned with respect to the sample, such that the distance between the probes becomes within the range of vision of the electro-optical device 4 or within the region seen in the thickness direction of a sample that is under the possible measurement range. In addition, the distance between each probe and the sample or the distance between the set of probes and the sample is made less than a predetermined value and more than zero seen in the direction perpendicular to the sample thickness direction, such that each probe and the set of probes become slightly separated from the sample seen in the direction perpendicular to the sample thickness direction (the distance is made as short as possible while a minimum distance or gap between the probes and the sample is maintained).

The probe stage 6 comprises a probe unit 33 provided with a probe holder 31 for holding the probes 3, a probe unit base 34 for holding the probe unit 33, and a probe unit support 35 for connecting the probe unit base 34 to the large stage 49. The probe unit 33 comprises x, y, and z tables (not shown), and it can move the probes 3 three-dimensionally. The base 48 is fixed on a side wall of the sample chamber 7 via a fixed member 47. The sample chamber 7 is provided with a sample exchange chamber 8 and a probe exchange chamber 9. The sample chamber 7 is provided with a field-through on a face plate 71, in order to send a signal for controlling operation of the x, y, and z tables of the probe unit 33 and a signal for controlling operation of x, y, and z tables of the sample stage 50 from the outside of the sample camber 7.

Figure 2:
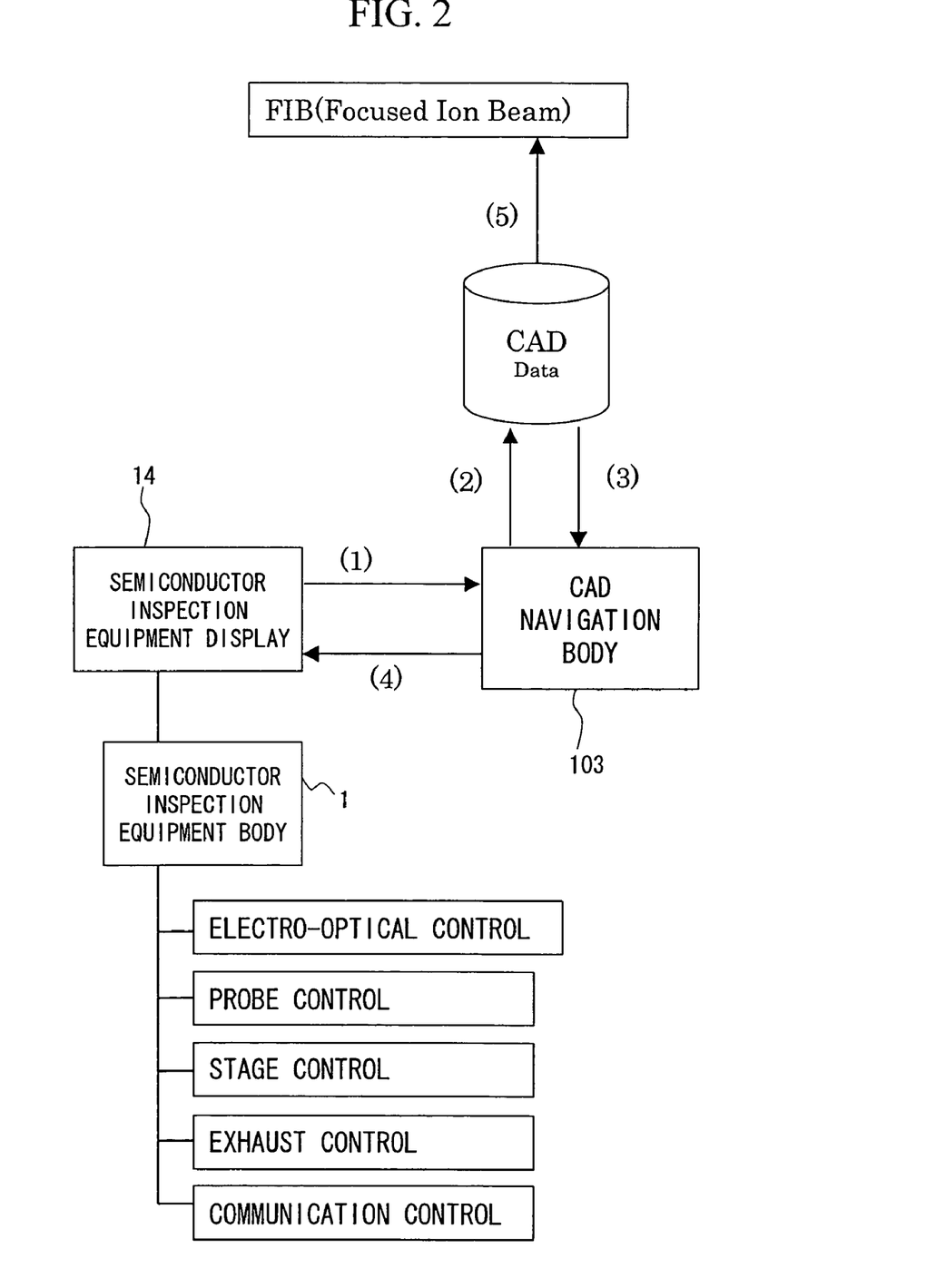
FIG. 2 shows a conceptual diagram concerning operation of software.

FIG. 2 shows a diagram of a basic concept concerning the operation of software of the present invention. A plurality of workstations and personal computers may constitute physical components of the CAD display and the semiconductor inspection equipment shown in FIG. 2. The present invention includes any physical components for creating CAD data as a semiconductor inspection/analysis system as a whole.

A SEM image of a semiconductor is displayed on the display 14 of the semiconductor inspection equipment. For the purpose of inspecting the semiconductor, a mark representing position, a mark representing electrical characteristics, and a mark representing completion of measurement are newly created and displayed, so that the marks are superimposed on the SEM image, using a mouse and keyboard. (1) to (5) of FIG. 2 show the flow of data. In (1) of FIG. 2, marked information is transferred to the CAD navigation body 105. In (2) of FIG. 2, CAD data is created in a general CAD data format, for example, in the GDSII stream format, in the CAD navigation body, and it is stored in a file or a database. Namely, mark information is converted into coordinates and wiring information, so as to create data in accordance with a CAD data format for manufacturing semiconductors. While such CAD data format is originally for data for creating a semiconductor, the marks created in the present case are for inspecting a semiconductor, thereby differing in the purpose. Thus, grids, figures, and markers are created in accordance with a format for creating CAD data.

For example, a CAD data format for storing grid data is created with array information indicating repetition. A CAD data format for storing characters, rectangles, and painted figures can be used without change. Circles, ovals, and painted circles are available depending on a CAD data format. If a format for circles is not available, polygons with multiple points are created and stored instead. Circle-attached characters can be composed of a combination of circles and characters. Since markers are not available in any CAD data format, an advanced function format (user-specific unique format) of a CAD is used. When a user-specific format is used, generally, there is a disadvantage that it cannot be used for CAD navigation between heterogeneous types.

A SEM image is not contained in stored data. Only figures drawn are stored in accordance with a CAD data format for creating semiconductors. Coordinate positions are calculated based on the position of a SEM image and stored in CAD data.

By unifying with the format used when creating semiconductors, an overlay with a CAD display used when creating semiconductors is enabled and only one kind of conversion format becomes necessary. For such reasons, the present format is used. After (3) of FIG. 2, the flow of data is the same as that of a conventional CAD navigation. In (3) of FIG. 2, CAD data is obtained, coordinate conversion is performed, and conversion into a format for an overlay on a SEM image is performed. In (4) of FIG. 2, converted data is transferred to the display of the semiconductor inspection equipment.

(5) of FIG. 2 indicates cooperation of CAD data with the FIB, which is another type of semiconductor inspection/analysis equipment. As a specific example, in the case of analysis on an SRAM, even when a defect is determined in one bit, since one bit is composed of six transistors, it is impossible to determine which transistor is defective. By examining electrical characteristics (such as VdId characteristics, VgId characteristics, or resistors) of transistors, using semiconductor inspection equipment, the defective transistor in question can be determined. In order to clarify the cause based on such transistor characteristics, it is often the case that a defective position is cut with the FIB. It is efficient if such defective position and cut surface are expressed by means of CAD data in the semiconductor inspection equipment. CAD data created with the semiconductor inspection equipment can be used for mere SEM observation or for a semiconductor inspection/analysis equipment such as the FIB.

Figure 3:
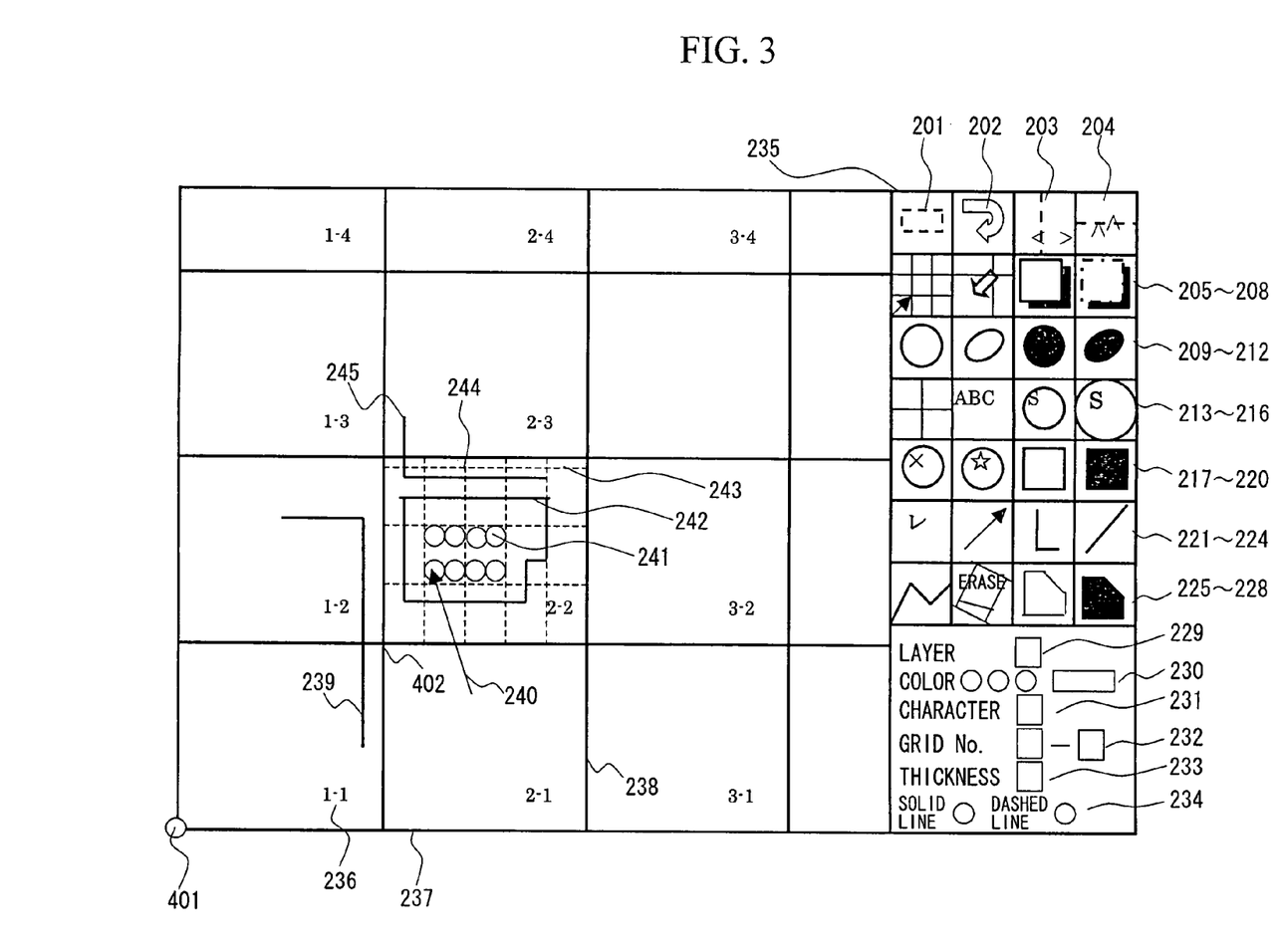
FIG. 3 shows an example of a display screen of the semiconductor inspection equipment of the present invention.

FIG. 3 shows an example of a display screen of the semiconductor inspection equipment of the present invention. The rectangle composed of 401 to 235 on the left side of the screen representing CAD data is overlay-displayed on an electron microscope image. On the right side of the screen, operation buttons 201 to 228 and operation property information 229 to 234 are displayed, so as to create CAD data with a simple mouse operation.

The operation buttons and property information will be hereafter described.

Area Selection Button 201

After clicking this button, a cursor is moved over to an electron microscope image and a start point and an end point are determined with mouse dragging, whereby a rectangular area composed of the two points can be selected. In this way, original data is determined, and therefore an operation, such as desired copying or mirror inversion, can be easily performed.

Rotation Button 202

With respect to the area selected with the area selection button 201, when this rotation button 202 is clicked, the area selected is rotated by 90 degrees clockwise. Another click on the button rotates the area further by 90 degrees. Further, by clicking the right mouse button, another window is displayed so that an arbitrary degree can be inputted, thereby rotating the entire CAD data by the designated degrees. This rotation operation is realized by rotating CAD data on the display without change in the contents of CAD data, and it can be realized with an easy operation as described above. Conventionally, while rotation has been handled only by performing raster rotation on the electron microscope image side, an overlay display is also enabled by rotating the CAD data side, too, thereby offering more alternatives.

X-axis Mirror Inversion Button 203

Figure 9:
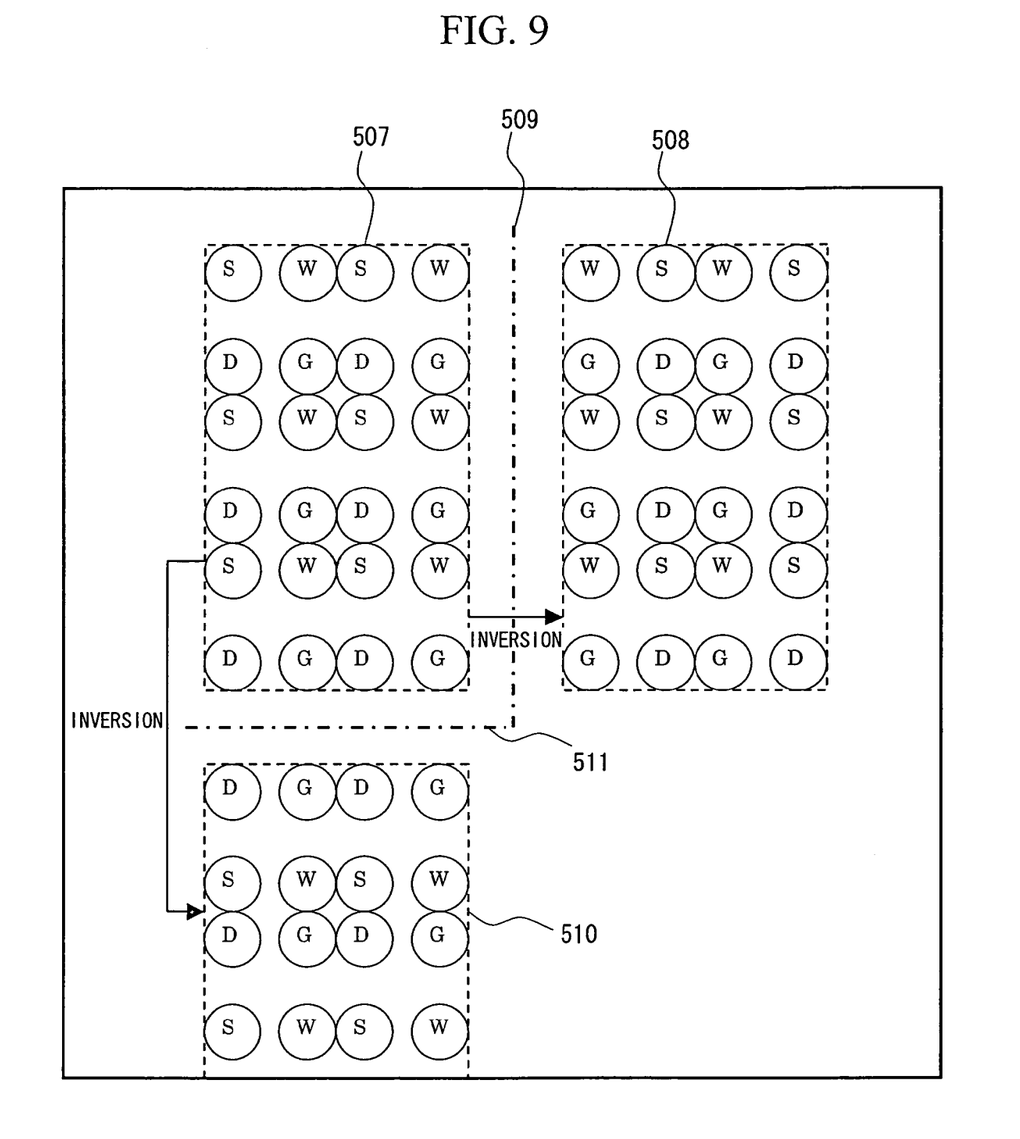
FIG. 9 shows a diagram for explaining mirror-inversion processing.

A dashed-line area 507 shown in FIG. 9 is selected with the area selection button 201. Next, after clicking an x-axis mirror inversion button 203, by performing dragging from a start point of a vertical line 509 in FIG. 9 to an end point on the screen, an area 508 that is mirror-inverted with respect to the x-axis is created based on the dashed-line area 507. In this way, the operation of an x-axis mirror inversion for creating a semiconductor with the same structure can be easily performed.

Y-axis Mirror Inversion Button 204

The dashed-line area 507 shown in FIG. 9 is selected with the area selection button 201. Next, after clicking a y-axis mirror inversion button 204, by performing dragging from a start point of a horizontal line 511 in FIG. 9 to an end point on the screen, an area 510 that is mirror-inverted with respect to the y-axis is created based on the dashed-line area 507. In this way, the operation of y-axis mirror inversion for creating a semiconductor with the same structure can be easily performed.

Grid Creation Button 205

Figure 5:
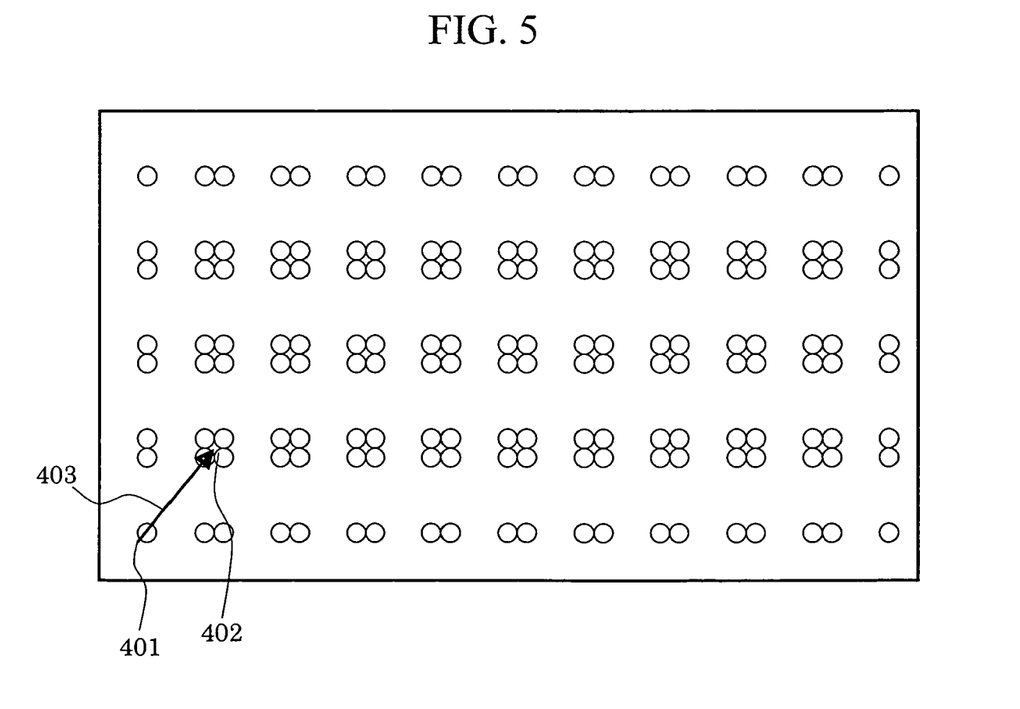
FIG. 5 shows a diagram for explaining a method for creating a grid.
Figure 6:
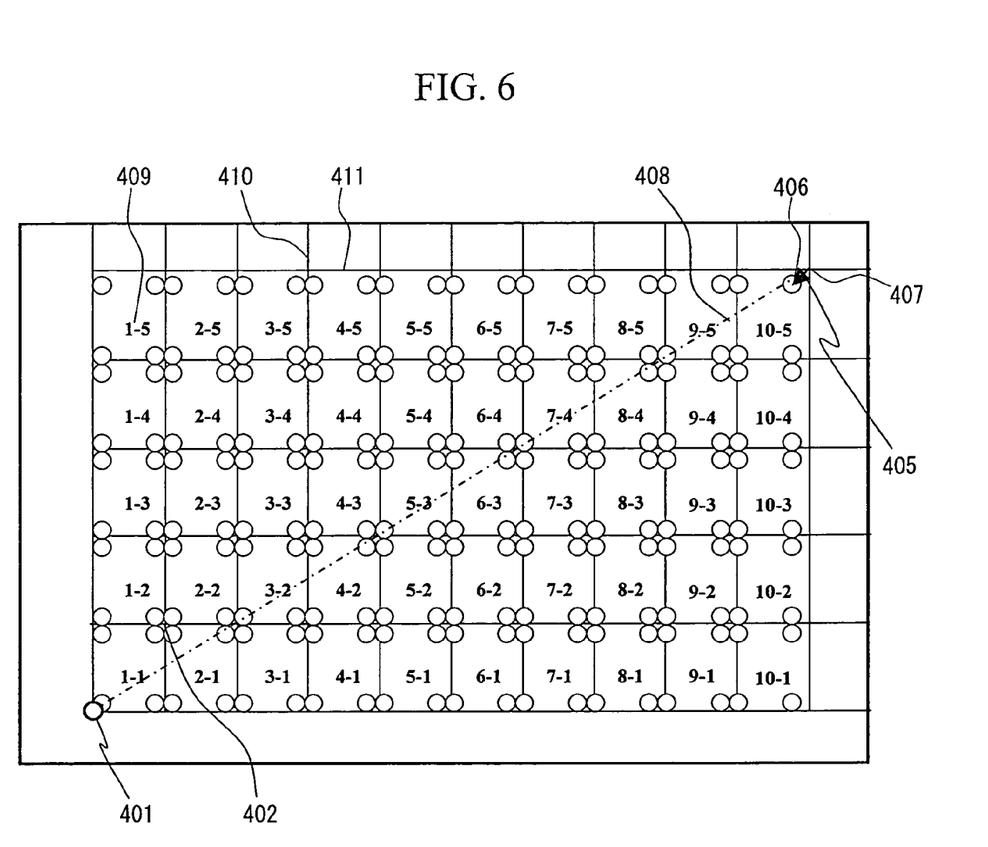
FIG. 6 shows another diagram for explaining the method for creating a grid.

Repetitive patterns of a start point 401, an end point 402, and a unit vector 403 are found in FIG. 5. By creating this grid, it becomes possible to count the repetitive patterns on the screen, whereby the transfer to a defective position can be performed accurately. After a grid creation button 205 is clicked, by performing dragging from 401 to 402 shown in FIG. 5 on the screen, a grid is created that has a unit rectangle represented with an arrow 403 composed of the two points of the drag start point 401 and end point 402. Upon such operation, grid vertical/horizontal numbers 409, grid vertical lines 410, and grid horizontal lines 411, which are shown in FIG. 6, are automatically displayed. Further, when a new grid is created in one rectangular area of the previously created grid (in 2-2 of FIG. 3), a grid (243, 244) for a higher magnification display is created in the rectangular area. Further accurate transfer to a defective position can be easily performed with the grid for a higher magnification display. Since individual rectangular areas formed in the grid are provided with systematic numbers 236 for representing vertical/horizontal arrangement, it is possible to easily determine which grid contains an intended defective position. With regard to the numbers indicating grid vertical and horizontal positions, while two ways of representation, 5-7 and (5, 7), are possible when the grid is horizontally the fifth and vertically the seventh, for example, a desired expression can be designated with an ini file.

Grid Correction Button 206

Figure 7:
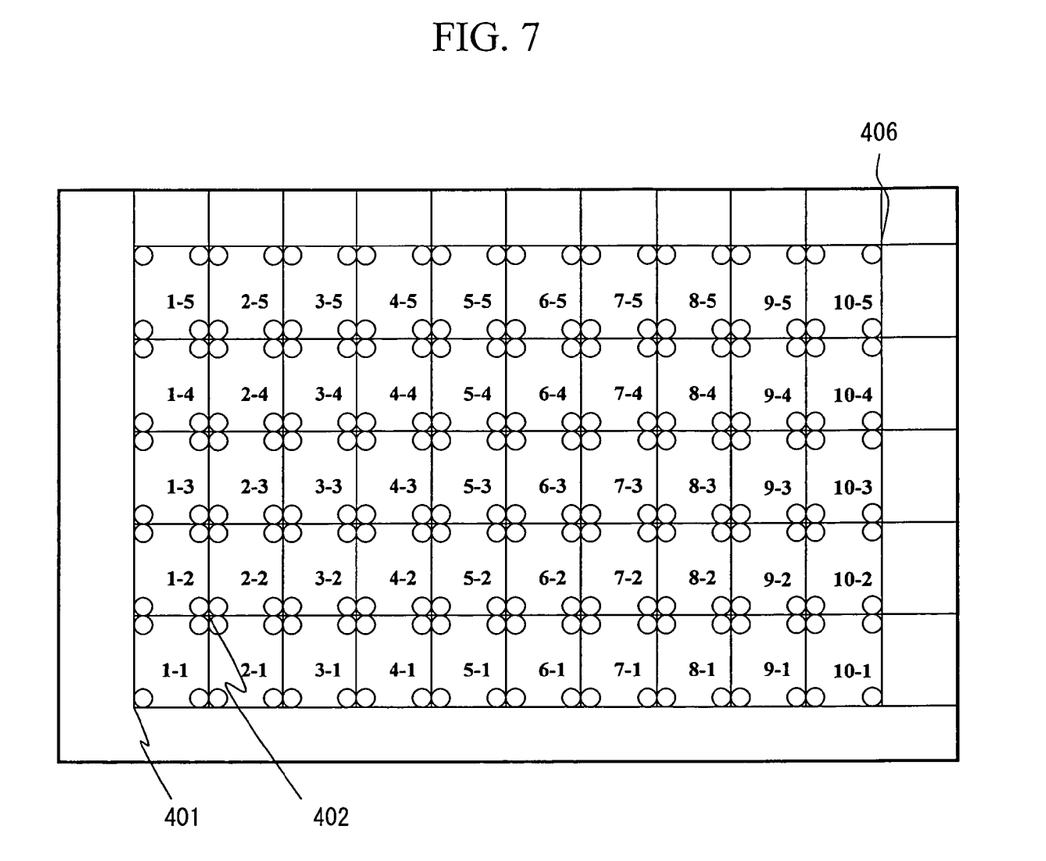
FIG. 7 shows another diagram for explaining the method for creating a grid.

A grid correction button 206 is used for correcting a grid created with the grid creation button 205. The grid correction button 206 is clicked, and dragging is performed from 407 to 406 of FIG. 6 on the grid of the screen. By performing a calculation from the grid start point 401 to the end point 406, the size of the grid is corrected so that the grid end point 406 becomes a grid point without changing the grid start point and the number of grids. As a result, the grid displayed as shown in FIG. 6 is corrected to a grid size that accords with an SEM image as shown in FIG. 7.

Further, by right-clicking the grid correction button 206 with respect to the grid created with the grid creation button 205 and by dragging the start and end points on the grid, the entire grid is translated. There are cases in which the entire grid is shifted to the lower left, for example, even when the grid size is matched. With this operation, the entire grid including the grid original points can be slid (parallel translation), whereby misalignment of the entire grid can be handled.

Generally, even when a grid unit is specified, error from the start point becomes larger as the number of grids is increased, and thus it becomes impossible to perform counting. Thus, with the two corrective operations of grid correction and parallel translation, fine adjustment of the entire grid can be performed, so as to freely create a grid that accords with a SEM image.

Copy Button 207

By selecting an area with the area selection button 201 and clicking a copy button 207, a copy destination rectangle corresponding to the mouse position is displayed. A copy destination is next determined with a mouse click. In this way, a desired copy operation can be easily performed.

Cut Button 208

By selecting an area with the area selection button 201 and clicking a cut button 208, a copy destination rectangle corresponding to the mouse position is displayed. A cut destination is next determined with a click. The difference from the processing with the copy button 207 is that data in the area selected with the area selection button 201 remains without change in the case of copying whereas data in the area selected with the area selection button 201 disappears and is moved to the copy destination in the case of cutting. For example, in cases in which data is copied on a position slightly different from an expected position, a desired copying operation can be easily performed again by moving the position with this cutting processing.

Circle Button 209

After clicking a circle button 209, dragging is obliquely performed from a start point to an end point on the screen.

A maximum circle inscribed in a rectangular area composed of the start point and the end point is displayed. With this operation, it becomes possible to easily create a desired circle superimposed on a SEM image, so as to express a single plug.

Oval Button 210

After clicking an oval button 210, dragging is obliquely performed from a start point to an end point on the screen. A maximum oval inscribed in a rectangular area composed of the start point and the end point is displayed. With this operation, it becomes possible to easily create a desired oval superimposed on a SEM image.

Painted Circle Button 211

After clicking a painted circle button 211, dragging is obliquely performed from a start point to an end point on the screen. A maximum painted circle inscribed in a rectangular area composed of the start point and the end point is displayed. With this operation, it becomes possible to easily create a desired painted circle superimposed on a SEM image.

Painted Oval Button 212

After clicking a painted oval button 212, dragging is obliquely performed from a start point to an end point on the screen. A maximum painted oval inscribed in a rectangular area composed of the start point and the end point is displayed. With this operation, it becomes possible to easily create a desired painted oval superimposed on a SEM image.

Alignment Button 213

Since a click on an alignment button 213 displays a crosshair cursor in the middle of the screen on the system side, a point that can easily be a reference for alignment is adjusted, and again, the alignment button is clicked, whereby a mark (a box+a crosshair cursor) for alignment is displayed. This mark for alignment is stored in CAD data. It is important that this alignment is present at an easily recognizable position on the SEM image when CAD data and an electron microscope image are overlaid. In order to match a SEM image and CAD data, three alignment points that are not in a line are necessary. With this operation, matching of an electron microscope image and CAD data can be easily performed when an overlay display is carried out next.

Character String Button 214

After clicking a character string button 214, characters are inputted in a character input 231. By mouse-clicking a start position for the character string, the character string is displayed on the screen. Since such character string is freely written, designers and inspectors, for example, can write comments, and information concerning defects can be shown on CAD data.

Circle-attached Minimum Character Button 215

After clicking a circle-attached minimum character button 215, a character is inputted in the character input 231 and a position that is to be the center of a circle on a SEM image is clicked, whereby a circle-attached minimum character is displayed. Since the size of a plug is gradually reduced, the explanation of such plug needs to be expressed with small characters. With this operation, recognizable minimum characters can be easily expressed.

Circle-attached Character Button 216

After clicking a circle-attached character button 216, a character is inputted in the character input 231 and dragging is obliquely performed from a start point to an end point on the screen. A maximum circle inscribed in a rectangular area composed of the start point and end point and the character are displayed. In this case, there is a limit to minimizing characters for display, and since the size of the circle differs from that of characters, the characters may not always be contained in the circle. With this operation, it becomes possible to unify the size of the circle and that of the plug on a SEM, easily write a desired circle and character at once, and easily perform the operation of creating a circle-attached character.

Marker Buttons 217 and 218

Figure 12:
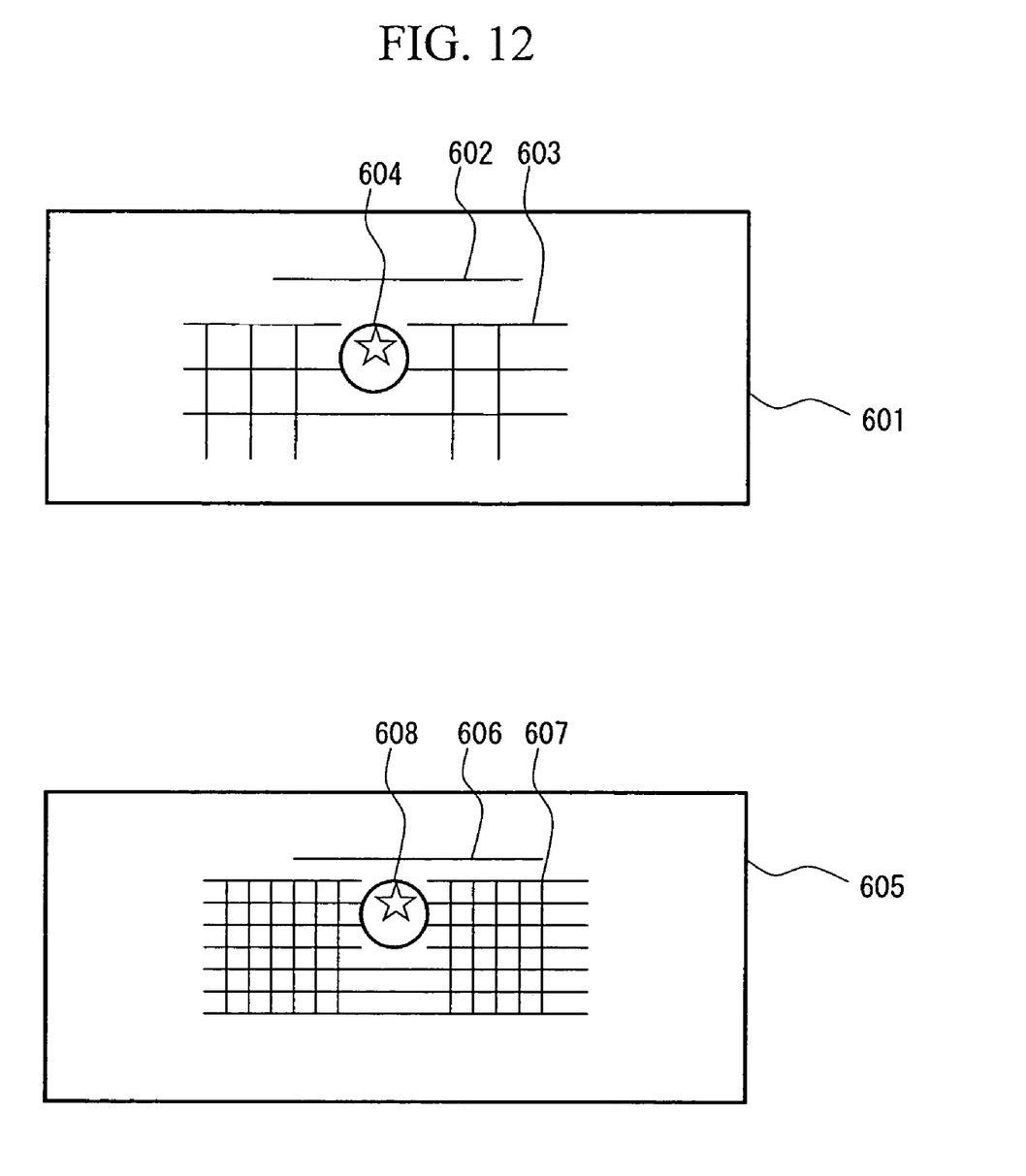
FIG. 12 shows a diagram for explaining marker display.

The difference between marker buttons 217 and 218 is only their design. After clicking the marker buttons (217, 218), by performing dragging with the left button of a mouse on the screen, a maximum design inscribed in a rectangular area composed of the two points of drag start and end points is displayed. In this case, a marker with a constant size irrespective of display magnification is displayed on the screen. FIG. 12 shows examples in which the same CAD data is overlay-displayed with different display magnification. Wires 602 and 603, and a marker 604 are displayed on a high-magnification screen 601. When the display magnification is changed to a lower magnification, wires 606 and 607, and a marker 608 are displayed on a low-magnification screen 605. Because of the change in display magnification, the distance between the wires 602 and 603 is more separated, compared with the distance between the wires 607 and 608. However, the size of the marker 604 at high magnification remains unchanged with respect to that of the marker 608 at low magnification. This means that the coordinate positions only recognizable at high magnification can be easily recognized at low magnification. However, since a CAD data format used for the purpose of manufacturing semiconductors does not have a function of indicating such size that does not change depending on display magnification, it can be realized by using an advanced function format of a CAD. A general CAD navigation that does not have such advanced function has a disadvantage that these markers cannot be displayed. If markers with a constant size are displayed on the screen irrespective of magnification, a target can be easily found at low magnification. Thus, they are most suitable as alignment marks and marks attached to target defective positions.

Rectangular Area Designation Button 219

After clicking a rectangular area designation button 219, by performing dragging with the left button of a mouse on the screen, a rectangular area composed of the two points of drag start and end points is displayed in the form of a frame. In this case, the frame is displayed with the attributes of a thickness 233 and solid line/dashed line 234 being effective. With this operation, rectangles can be easily drawn. Since horizontal/vertical lines are much more frequently used than diagonal lines, the operation for the rectangular area using horizontal/vertical lines is user-friendly and easily carried out.

Painted Rectangular Area Designation Button 220

By clicking a rectangular area designation button 220 and performing dragging with the left button of a mouse on the screen, a painted rectangular area composed of the two points of drag start and end points is displayed. For example, when displaying an area on which measurement has been completed, the processing for a painted rectangular area can be substituted for a tick. With this operation, a desired rectangular area painting processing can be easily realized.

Tick Button 221

By clicking a tick button 221 and mouse-clicking a tick center on the screen, a tick is displayed. With this operation, it becomes possible to easily recognize a plug on which measurement has been completed, and occurrence of measurement on an erroneous plug will be eliminated even after raster rotation is performed. By designating a layer different from those of other information, the display or the nondisplay of the tick can be easily changed. A sign such as "x" or "/" can be substituted for the tick. Anything will do as long as plugs on which measurement has been completed can be easily expressed.

Arrow Button 222

By clicking an arrow button 222 and performing dragging with the left button of a mouse on the screen, an arrow pointing from the drag start point to the end point is displayed. This operation can be used for drawing a lead line when it is difficult to attach characters or signs to a plug due to a narrow area. An arrow 240 shown in FIG. 3 is an example of such arrow displayed with the arrow button 222.

Horizontal/vertical Line Button 223

By clicking a horizontal/vertical line button 223 and performing clicking with the left button of a mouse on the screen, a straight line using the first click point as a start point and using an x-coordinate or a y-coordinate of the next click point as an end point coordinate (the value of the y-coordinate or x-coordinate of the end point is the same as that of the start point) is displayed either vertically or horizontally, depending on closeness. If clicked continuously, horizontal lines and vertical lines connected in the form of a polygonal line are alternatively displayed. This operation is mainly used for displaying a wire as a landmark, and by indicating wires, it becomes easier to determine a target position. Further, since the thickness, type (solid/dashed), and color of the line can be changed, the line can be used as a landmark. Lines 239 and 245 of FIG. 3 are figures drawn with this horizontal/vertical line button 223.

Straight Line Button 224

By clicking a straight line button 224 and performing dragging with the left button of a mouse on the screen, a straight line connecting the drag start point to the end point is displayed. Since the thickness, type (solid/dashed), and color of the line can be changed, the line can be used as a landmark.

Polygonal Line Button 225

By clicking a polygonal line button 225 and performing clicking with the left button of a mouse on the screen, a line connecting the first click point to the next click point is displayed. Another click displays another line connecting the point clicked second last to the point clicked last. If this processing is repeated, a polygonal line can be displayed. Further, since the thickness, type (solid/dashed), and color of the line can be changed, the line can be used as a landmark.

Redo Button 226

By left-clicking a redo button 226, the last processing is cancelled. By right-clicking the redo button 226, the last cancel processing is restored. For example, when a position slightly different from an intended position is obtained with an operation of y-axis mirror inversion, by using the redo button 226, the operation of y-axis mirror inversion can be easily redone.

Polygon Button 227

By clicking a polygon button 227 and performing sequential clicking with the left button of a mouse on the screen, gaps among the click points are sequentially connected with a straight line. A polygonal line is displayed by repeating this processing. By performing double-clicking on the last point or by clicking the polygon button 227 again, a straight line connecting the last point and the first point is drawn, whereby a closed polygon is drawn. Further, since the thickness, type (solid/dashed), and color of the line can be changed, the line can be used as a landmark. A polygon 242 (see FIG. 3) drawn with the polygon button 227 can be used when a target is indicated by area.

Painted Polygon Button 228

By clicking a painted polygon button 228 and performing sequential clicking with the left button of a mouse on the screen, gaps among the click points are sequentially connected with a straight line. A polygonal line is displayed by repeating this processing. By performing double-clicking on the last point or by clicking the painted polygon button 228 again, a straight line connecting the last point and the first point is drawn. Painting is carried out when a closed convex-type polygon is formed. In this way, a desired painted polygon can be obtained, so as to create an area as a landmark.

Layer Selection Box 229

By inputting numbers in a layer selection box 229, layers divided into display hierarchies can be designated. The layer selection is effective in all the drawing processing on the screen. Smaller numbers indicate lower layers. Necessary layers can be displayed by dividing layers and storing them in CAD data.

Color Selection Part 230

When selecting red, blue, or green, the color to be drawn is designated by clicking a radio button. When designating colors other than the above colors, selection is made using a color pallet.

Character Input 231

When inputting characters for the character-related buttons 214 to 216, the region of a character input 231 shows an input region of characters from a keyboard. Specifically, by inputting D in the character input 231 and creating the circle-attached character 215, character D with a circle is displayed on the screen.

Grid Number Selection 232

By ticking two checkboxes indicating an x-axis grid number and a y-axis grid number, numbers such as x- and y-grid number 236 (see FIG. 3) are displayed.

Thickness Selection 233

It is used for buttons for line-drawing processing, and the thickness of a line can be selected.

Line Type Selection 234

It is used for buttons for line-drawing processing, and either a solid line or a dashed line can be selected.

By using the input part composed of the area selection button 201 to the line type selection 234 for selecting attributes, it becomes possible to draw figures, symbols, characters, and the like on an electron microscope image, as shown on the left side of FIG. 3. After CAD data indicating defective positions are created on the screen, a saving-to-a-file button on a different screen or a pull-down menu is selected, so as to create a CAD file in which figures, symbols, characters, and the like drawn on the electron microscope image are stored as CAD data.

Figure 4:
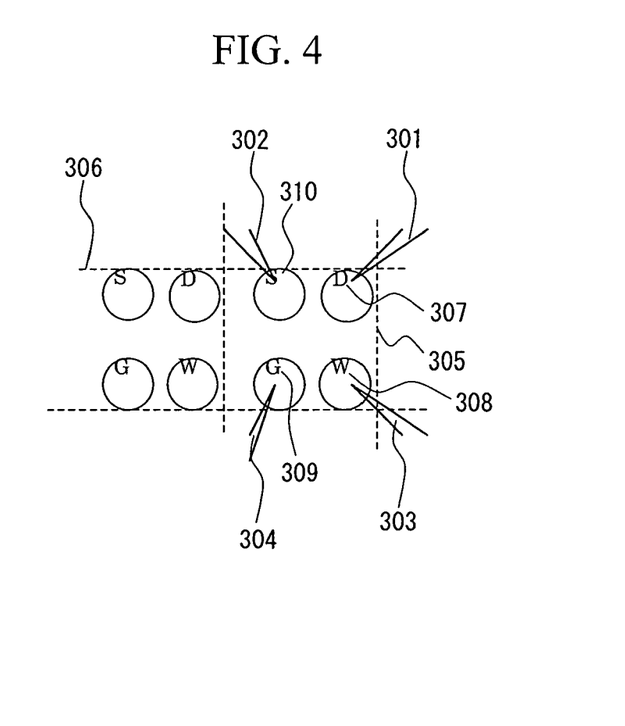
FIG. 4 shows an enlarged diagram of the screen.

In FIG. 3, a grid is contained in a grid 2-2, thereby expressing a plurality of hierarchies. FIG. 4 shows an enlarged view of a portion of the hierarchies.

FIG. 4 is a diagram in which probing is being performed on individual plugs, a drain 307, a well 308, a gate 309, and a source 310, using probes 301 to 304. A grid is indicated with dashed lines 305 and 306. In the figure, by using the circle-attached character button 216, circle-attached character D is drawn superimposed on the position of the drain on an electron microscope image, circle-attached character W on the position of the well, circle-attached character G on the position of the gate, and circle-attached character S on the position of the source. If an initial letter is attached to a plug in this way, it becomes clear that which plugs have already been probed.

FIG. 5 shows a diagram for explaining a method for creating grids. After the grid creation button 205 shown in FIG. 3 is clicked, dragging is performed from position 401 to position 402. The arrow 403 is displayed during dragging.

Upon completion of dragging at the position 402 shown in FIG. 5, grids 410 and 411 are drawn as shown in FIG. 6. The drag start position 401 becomes the grid origin, and a grid having a unit grid rectangle with a diagonal line connecting the position 401 and the position 402 is drawn. Referring to the figure, while a grid ⌈1-1⌋ in the bottom-left corner seems correctly displayed, when a grid ⌈10-5⌋ in the top right is referred to, it can be seen that an intended grid is not accurately created at the positions of the plugs. In this case, by left-clicking the grid correction button 206 shown in FIG. 3 and clicking the top-right grid point of the grid ⌈10-5⌋ as if grabbing it, a grid point 407 starts to move in accordance with the mouse operation. During this operation, an additional line 408 from the origin is also displayed. By performing dragging as indicated by an arrow 405 and completing mouse-dragging at a correct position 406, correction of the distance between grid lines is performed such that the grid size is equalized from the origin, whereby the grids 401 and 411 as shown in FIG. 7 are displayed. Generally, both the origin 401 of FIG. 6 and the grid point 407 used for error determination are not contained in one screen of an electron microscope, and therefore, the entire grid size from the origin is equally corrected without the origin 401 on the screen. When an accurate grid is created by repeating this processing several times, correction is completed by left-clicking the grid correction button 206 of FIG. 3.

Further, in cases where the entire grid needs to be equally slid because the origin position is inaccurate while the grid size is adjusted, the grid correction button 206 of FIG. 3 is right-clicked and the entire CAD data grid alone is moved by grabbing an intersection point of the grid, whereby correction is enabled.

Figure 8:
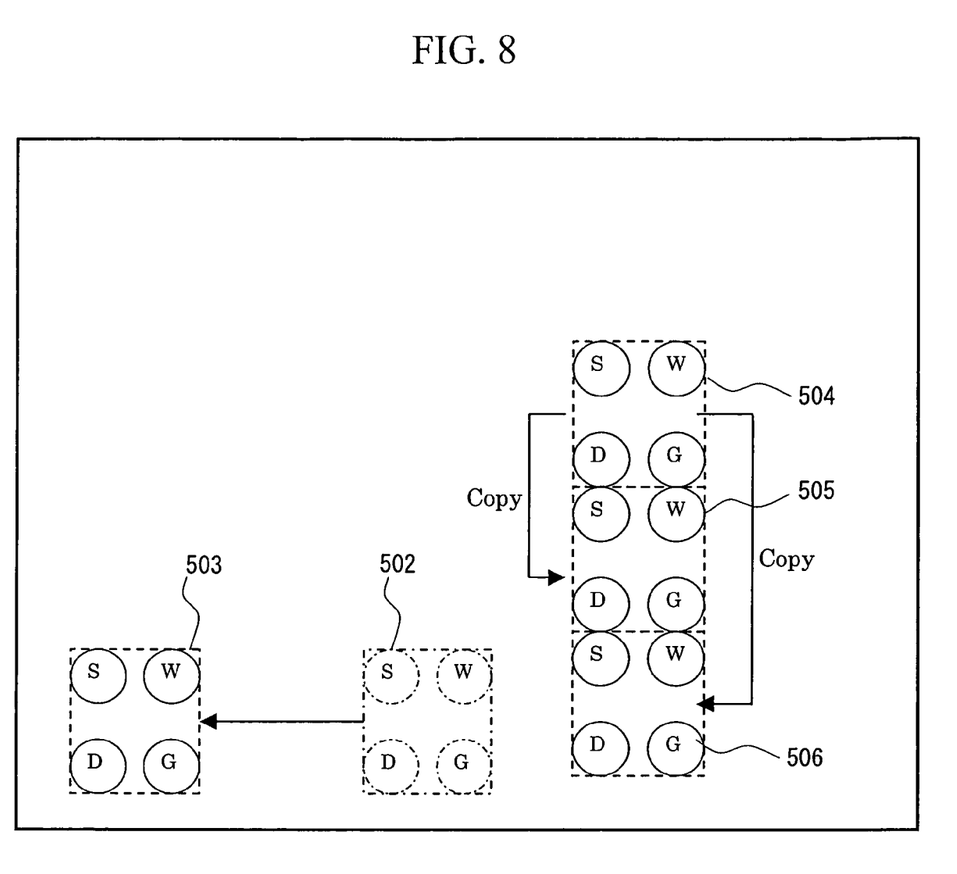
FIG. 8 shows a diagram for explaining copy processing.

As a specific example 1, regarding a semiconductor memory, particularly a DRAM in which similar plugs are regularly arranged, it is not easy to attach types to plugs that need to be measured, using an electron microscope image alone. FIG. 8 shows an example of copy processing with respect to plugs. After the area selection button 201 is clicked, a copy source area 504 is designated by creating a rectangle with a mouse drag. An example in which copying 207 is performed from the copy source 504 to the areas of copy destinations 505 and 506 is shown. Further, an example in which cutting processing from 502 to 503 is performed using the cut button 208 is shown. Of course, when the copy source area is made larger, more copies can be made at once. These copy processing and cutting processing are performed such that a circle-attached character S is superimposed on the position of a source of an electron microscope image displayed on the screen, a circle-attached character W on the position of a well, a circle-attached character D on the position of a drain, and a circle-attached character G on the position of a gate. In this way, a large number of symbols corresponding to the position of each plug on an electron microscope image can be efficiently attached.

Further, regarding constitution of a semiconductor plug, mirror inversion is often seen. FIG. 9 shows an example of processing with respect to a device that is mirror-inverted. Plugs formed symmetrically with respect to boundaries 509 and 511, which are mirrors, appear on an electron microscope image. In the present example, an operator first draws a group of circle-attached characters such that they are superimposed on the positions of the sources, drains, wells, and gates of the electron microscope image, as shown in an area 507. By using the group as a copy source, a mirror-inverted copy is created in a copy destination area 508 symmetrical with respect to the boundary 509, using the x-axis mirror inversion button 203. Further, by using the group of symbols drawn in the area 507 as a copy source, a mirror inverted copy is created in a copy destination area 510 symmetrical with respect to the boundary 511, using the y-axis mirror inversion button 204. Thus, by using the processing buttons for copying, cutting, and mirror inversion, usability is significantly improved, compared with cases in which identification symbols are individually attached.

Figure 10:
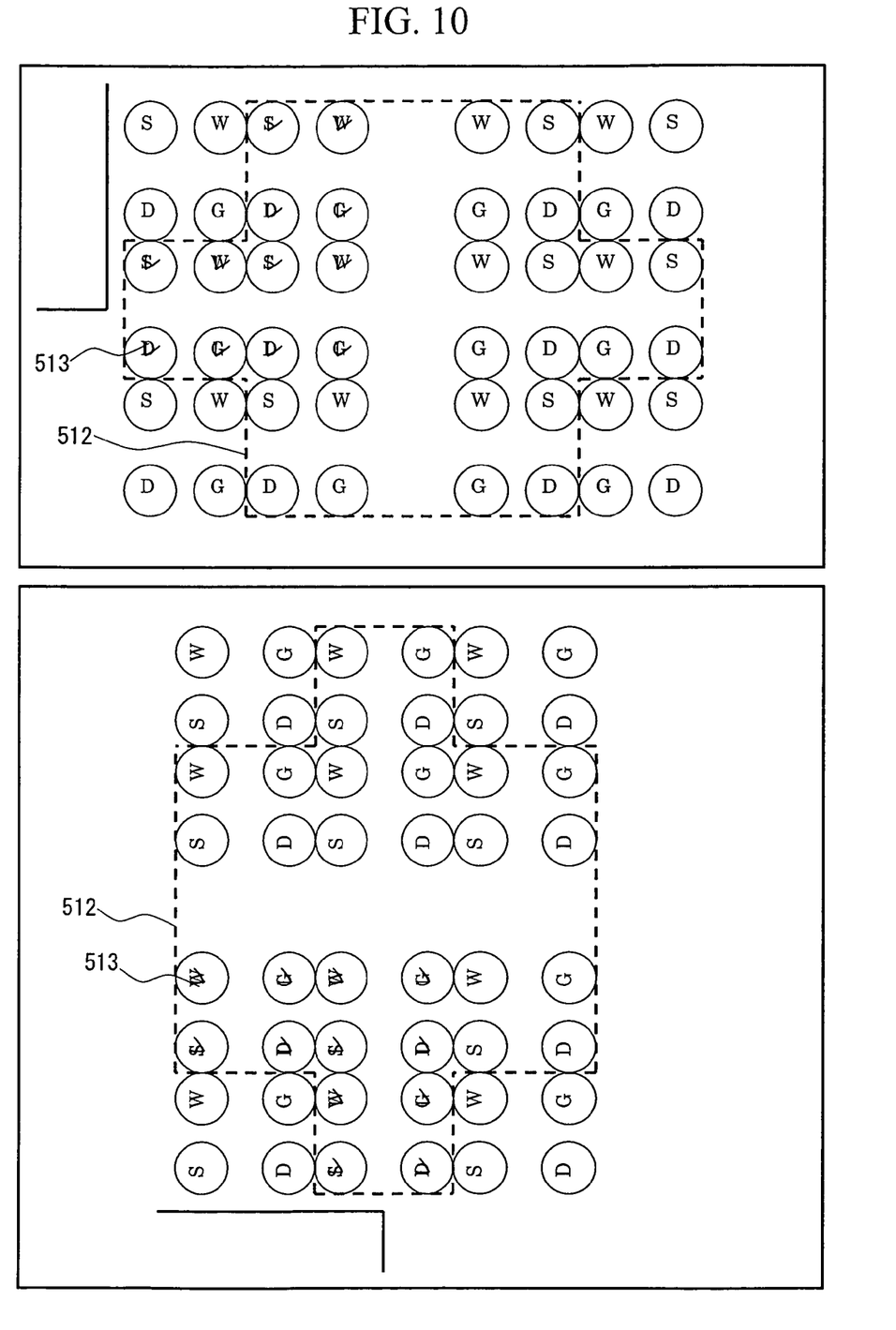
FIG. 10 shows a diagram for explaining rotation processing.

As a specific example 2, FIG. 10 shows an example of how an area and a tick are used. An area 512 is an area where electrical characteristics need to be measured by bringing the probes of the semiconductor inspection equipment into contact therewith. If completion of measurement per transistor is marked with a tick 513, the next transistor to be measured can be clarified. Further, the lower diagram in FIG. 10 shows a representation of the upper diagram rotated by 90 degrees with the rotation button 202. Rotation is indispensable due to ease of probe application. However, rotation makes it difficult to determine to what extent measurement has been completed. Particularly, when magnification is changed and a similar pattern is repeated, mistakes can be often made. However, as shown in the figure, if the measurement range is clear, the type of each plug is recognizable, and the completion of measurement is indicated with a tick, it is very obvious where to measure next. Further, a method for painting areas that have already been measured with a painted polygon button 228 can clarify measurement completed portions in the same sense.

Figure 11:
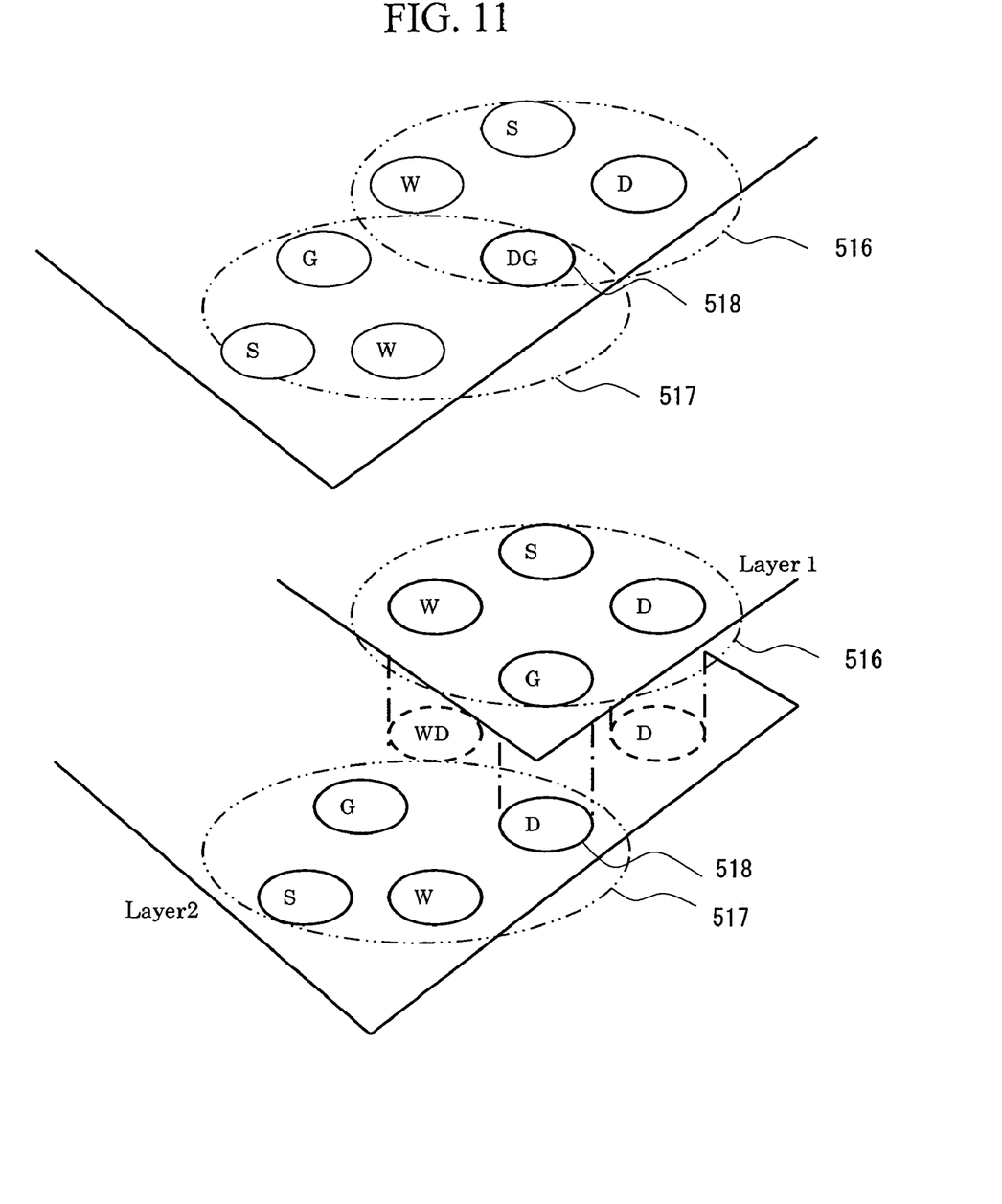
FIG. 11 shows a diagram for explaining layer display.

As a specific example 3, as an example of an actual semiconductor, there are cases in which a single transistor has two meanings. FIG. 11 shows such a case. While numeral 516 denotes a single transistor and numeral 517 also denotes a single transistor, the problem is that a plug 518 refers to the gate of the transistor 516 and refers to the drain of the transistor 517. In this case, if an initial letter and a tick are inserted in the same way as described above, it is impossible to determine which plug is overlapped. In such case, by separating a layer into two and displaying either of the two, plugs are clearly determined. Further, regarding ticks in this case, too, it is clear that determination is easier if ticks are attached to individual layers.

FIG. 12 shows an example of displaying markers. The purpose of displaying markers is not for expressing the actual size thereof but for using them as landmarks. Namely, even when a mark with an accurate size is attached to a defective position, it is very troublesome to find the mark when displayed at low magnification. Further, if a larger mark is attached, the accuracy is decreased because it becomes too large when displayed at high magnification or it interferes with information in question. Thus, by displaying the individual markers 604 and 608 with a constant size irrespective of magnification between the high-magnification display screen 601 and the low-magnification display screen 605, the above problems are solved. Numerals 602, 603, 606, and 607 in FIG. 12 refer to wires. Of course, the distance between the wires is changed depending on magnification.

Each of the examples described above merely shows an example of the present invention, and the present invention is not limited to such examples. Further, each of the methods of operation also indicates a mere example, and thus the inventive methods of operation are not limited to such methods of operation.

What is claimed:

1. A semiconductor inspection equipment comprising:
   a movable stage for holding a semiconductor sample;
   a sample image acquisition unit for irradiating the semiconductor sample held on the stage with a charged particle beam and obtaining a sample image through a sample signal discharged from the sample due to irradiation of the charged particle beam;
   a memory unit for storing CAD data concerning the semiconductor sample; and
   a display unit capable of displaying the CAD data such that it is superimposed on the sample image obtained by the sample image acquisition unit,
   wherein the equipment has a grid creation means of generating a grid composed of vertical and horizontal lines having a constant distance and displaying the grid superimposed on the sample image displayed on the display unit, and a means of generating systematic numbers indicating vertical and horizontal positions of a plurality of rectangular areas contained in the grid created by the grid creation means and displaying the numbers in relevant areas in the grid displayed on the display unit.

2. The semiconductor inspection equipment according to claim 1, wherein the grid creation means has a function of generating another grid having a narrower distance between the lines thereof in one rectangular area in the previously created grid.

3. The semiconductor inspection equipment according to claim 1, comprising a means of storing, as CAD data, the grid generated by the grid creation means and superimposed on the sample image displayed on the display unit.

4. The semiconductor inspection equipment according to claim 1, comprising a means of generating characters, symbols, lines, figures, and/or painted figures, and superimposing them on the sample image displayed on the display unit.

5. The semiconductor inspection equipment according to claim 4, comprising a means of copying, as a pattern, the characters, symbols, lines, figures, and/or painted figures contained in a designated area of the sample image displayed on the display screen, a means of performing cutting processing on the pattern, a means of creating an x-axis mirror-inverted copy of the pattern, and a means of creating a y-axis mirror-inverted copy of the pattern.

6. The semiconductor inspection equipment according to claim 4, comprising a means of storing, as CAD data, the characters, symbols, lines, figures, and/or painted figures superimposed on the sample image displayed on the display unit.

7. The semiconductor inspection equipment according to claim 1, comprising a means of superimposing a marker, displayed with the same size irrespective of the display magnification of the sample image, on the sample image displayed on the display unit.

8. The semiconductor inspection equipment according to claim 7, comprising a means of storing, as CAD data, the marker superimposed on the sample image displayed on the display unit.

9. A semiconductor inspection method, comprising;
irradiating a semiconductor sample held on a movable stage with a charged particle beam and obtaining a sample image through a sample signal discharged from the sample;
generating a grid composed of vertical and horizontal lines having a constant distance and displaying the grid such that it is superimposed on the sample image; and
generating systematic numbers indicating vertical and horizontal positions of a plurality of rectangular areas contained in the grid and displaying the numbers in relevant areas in the grid.

10. The semiconductor inspection method according to claim 9, wherein the distance of the grid superimposed on the sample image is adjusted.

11. The semiconductor inspection method according to claim 9, wherein another grid having a narrower distance between the lines thereof is generated in one rectangular area in the previously created grid.

12. The semiconductor inspection method according to claim 9, wherein the grid superimposed on the sample image is stored as CAD data.

13. The semiconductor inspection method according to claim 9, wherein characters, symbols, lines, figures, and/or painted figures are superimposed on the sample image displayed on the display unit.

14. The semiconductor inspection method according to claim 13, wherein the characters, symbols, lines, figures, and/or painted figures contained in a designated area of the sample image displayed on the display unit are copied as a pattern.

15. The semiconductor inspection method according to claim 13, wherein an x-axis or y-axis mirror-inverted copy of the characters, symbols, lines, figures, and/or painted figures contained in a designated area of the sample image displayed on the display unit is created as a pattern.

16. The semiconductor inspection method according to claim 13, wherein the characters, symbols, lines, figures, and/or painted figures superimposed on the sample image displayed on the display unit are stored as CAD data.

17. The semiconductor inspection method according to claim 9, wherein a marker displayed with the same size irrespective of the display magnification of the sample image is superimposed on the sample image displayed on the display unit.

18. The semiconductor inspection method according to claim 17, wherein the marker superimposed on the sample image displayed on the display unit is stored as CAD data.

19. A computer readable medium bearing a program for causing a computer to perform the steps of:
displaying a grid composed of vertical and horizontal lines having a constant distance such that the grid is superimposed on a sample image obtained through an electron microscope;
generating systematic numbers indicating vertical and horizontal positions of a plurality of rectangular areas contained in the grid and displaying the numbers in relevant areas in the grid; and
storing the grid superimposed on the sample image as CAD data.

* * * * *